US006991826B2

(12) United States Patent
Pellerite et al.

(10) Patent No.: US 6,991,826 B2
(45) Date of Patent: Jan. 31, 2006

(54) ANTISOILING COATINGS FOR ANTIREFLECTIVE SUBSTRATES

(75) Inventors: Mark J. Pellerite, Woodbury, MN (US); Rudolf J. Dams, Zwijndrecht (BE); Steven J. Martin, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/828,451

(22) Filed: Apr. 20, 2004

(65) Prior Publication Data

US 2005/0233070 A1    Oct. 20, 2005

(51) Int. Cl.
*C23C 14/12* (2006.01)
*C23C 14/24* (2006.01)
*G02C 7/02* (2006.01)
*G02B 1/10* (2006.01)

(52) U.S. Cl. ............ 427/164; 427/561; 427/567; 427/568; 427/167; 427/255.6; 118/719; 351/166; 351/177

(58) Field of Classification Search ............ 427/162, 427/164, 166, 167, 255.6, 255.7, 402, 561, 427/567, 568; 118/719; 351/159, 166, 177; 359/580, 581, 582
See application file for complete search history.

(56) References Cited

U.S. PATENT DOCUMENTS

| | | | |
|---|---|---|---|
| 3,646,085 A | 2/1972 | Bartlett | |
| 5,851,674 A | 12/1998 | Pellerite et al. | |
| 5,853,800 A * | 12/1998 | Dombrowski et al. | 427/162 |
| 6,119,626 A * | 9/2000 | Miyazawa et al. | 118/723 VE |
| 6,264,751 B1 * | 7/2001 | Kamura et al. | 118/725 |
| 6,277,485 B1 | 8/2001 | Invie et al. | |
| 6,296,793 B1 * | 10/2001 | Anthes et al. | 264/104 |
| 6,542,302 B2 * | 4/2003 | Cross | 359/581 |
| 6,610,363 B2 * | 8/2003 | Arora et al. | 427/255.5 |
| 2003/0003227 A1 | 1/2003 | Kono | |
| 2004/0047047 A1 * | 3/2004 | Yamaguchi et al. | 359/666 |
| 2004/0076750 A1 * | 4/2004 | Boulineau et al. | 427/248.1 |
| 2004/0142185 A1 * | 7/2004 | Takushima | 428/447 |

FOREIGN PATENT DOCUMENTS

| | | |
|---|---|---|
| EP | 1 255 129 A2 | 11/2002 |
| JP | 10-26701 | 1/1998 |
| WO | WO 03/085161 A1 | 10/2003 |

OTHER PUBLICATIONS

J. Choi, M. Kawaguchi, and T. Kato, "Self-Assembled Monolayer Formation On Magnetic Hard Disk Surface And Friction Measurements", *Journal Of Applied Physics*, vol. 91, No. 10, May 15, 2002, pp. 7574-7576.4.

* cited by examiner

*Primary Examiner*—Timothy Meeks
*Assistant Examiner*—Wesley D. Markham
(74) *Attorney, Agent, or Firm*—Michael C. Geise; Kent S. Kokko

(57) ABSTRACT

This invention relates to antisoiling compositions for antireflective substrates. More particularly, this invention relates to methods for depositing antisoiling compositions onto antireflective substrates. In particular, this invention relates to a method of depositing an antisoiling composition on an antireflective substrate comprising vaporizing an antisoiling composition and depositing the antisoiling composition onto an antireflective substrate. In another aspect, this invention relates to method of preparing an antireflective film stack comprising depositing an antireflective layer onto the surface of a transparent substrate and vapor depositing an antisoiling layer onto the surface of the antireflective layer. In yet another aspect, this invention relates to a method of depositing an antisoiling composition on an antireflective coated ophthalmic lens comprising vaporizing an antisoiling composition and depositing the antisoiling composition onto an antireflective coated ophthalmic lens.

14 Claims, No Drawings

ANTISOILING COATINGS FOR ANTIREFLECTIVE SUBSTRATES

FIELD OF INVENTION

This invention relates to antisoiling coatings for antireflective substrates. More particularly, this invention relates to methods for depositing antisoiling coatings onto antireflective substrates.

BACKGROUND OF THE INVENTION

The transparency of glass or plastic, in the form of doors, windows, lenses, filters, display devices (e.g., display panels) of electronic equipment, and the like, can be impaired by glare or reflection of light. To reduce the amount of glare, for example, on plastic or glass, the surface typically includes a single layer of metal oxide (such as silicon dioxide), a metal fluoride, a metal nitride, a metal sulfide, or the like. Such coatings function as antireflective coatings.

Antireflective coated lenses represent a relatively small but rapidly growing segment of the ophthalmic lens market. These antireflective coated lenses are finding favor among consumers due to their enhanced cosmetic aspects and increased transmittance. Increased transmittance is of particular importance for applications such as night driving. Typically, antireflective ophthalmic lenses consist of a polycarbonate or other plastic base lens bearing a hard coat, with antireflective properties conferred by a multilayer stack of vacuum deposited metal oxides. The outermost layer in most antireflective stacks is silicon dioxide.

If left untreated, the high surface energy and porous structure of the antireflective stack render it easily contaminated and difficult to clean. Furthermore, the antireflective properties are extremely sensitive to and easily compromised by trace levels of organic contamination such as skin oils. Thus, the ophthalmic lens industry has developed a class of hydrophobic coatings that are applied to antireflective lenses in a final processing step.

Low molecular weight chloro- or alkoxy-functional alkylsilanes such as octyl- or perfluorooctylethylsilanes deposited from the vapor phase are commonly used in commercial hydrophobic coatings. Such films in the monolayer thickness range can effectively seal the surface and provide some antisoiling properties without interfering with the optical properties of the antireflective stack. The durability of these films, however, to dry rub abrasion is relatively poor, and the industry continues to search for a treatment with better initial oil and stain repellency. This problem has largely been addressed by a number of new antisoiling coatings comprising perfluoropolyether silanes.

SUMMARY OF THE INVENTION

The present invention provides a method for coating an antireflective substrate with an antisoiling composition. In one embodiment, the present invention provides a method of depositing an antisoiling composition on an antireflective substrate comprising vaporizing an antisoiling composition and depositing the antisoiling composition onto an antireflective substrate, wherein the antisoiling composition is selected from the group consisting of:

$C_nF_{2n+1}O(CF(CF_3)CF_2O)_zCF(CF_3)C(O)NHC_xH_{2x}Si(L)_3$
wherein n is 1 to 4, z is 3 to about 15 and x is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms;

$X$—$CF(CF_3)(OCF_2CF(CF_3))_mO(C_nF_{2n})O(CF(CF_3)CF_2O)_qCF(CF_3)$—$X$, wherein m is an integer of 0 to about 40, n is an integer of 2 to 4, q is an integer of 0 to about 40, wherein both m and q are not equal to 0, and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; and $XCF_2O(CF_2O)_m(C_2F_4O)_pCF_2X$ wherein m is 1 to about 20, p is 1 to about 20 and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; and combinations thereof, wherein the average molecular weight of the antisoiling composition is about 800 to about 6000.

In a preferred embodiment, the transparent substrate may comprise an ophthalmic lens. It is preferred, furthermore, that the antireflective layer is selected from the group consisting of a metal oxide, a metal fluoride, a metal nitride, and a metal sulfide. An antireflective layer of silicon dioxide is most preferred. In a further aspect, the invention provides a method for depositing multiple antireflective layers onto the surface of the transparent substrate before vapor depositing the antisoiling layer.

DETAILED DESCRIPTION

Due to their higher molecular weights, perfluoropolyether silanes are typically applied by known techniques such as continuous roll coating, such as with a gravure coater, or dip coating. These application techniques have a number of drawbacks, including the problem that manufacturing-scale automated precision equipment can be very costly for each site and requires additional floor space and may require additional labor to run. Such traditional coating techniques may also cause contamination of the lens surface through additional handling and exposure to the environment, leading to correspondingly lower yield losses. Thus, there is a need in the art for alternative methods of deposition of perfluoropolyether silanes.

The present invention provides a method for coating an antireflective substrate with an antisoiling composition. In one embodiment, the present invention provides a method of depositing an antisoiling composition on an antireflective substrate comprising vaporizing an antisoiling composition and depositing the antisoiling composition onto an antireflective substrate, wherein the antisoiling composition is selected from the group consisting of:

$C_nF_{2n+1}O(CF(CF_3)CF_2O)_zCF(CF_3)C(O)NHC_xH_{2x}Si(L)_3$
wherein n is 1 to 4, z is 3 to about 15 and x is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms;

$X$—$CF(CF_3)(OCF_2CF(CF_3))_mO(C_nF_{2n})O(CF(CF_3)CF_2O)_qCF(CF_3)$—$X$, wherein m is an integer of 0 to about 40, n is an integer of 2 to 4, q is an integer of 0 to about 40, wherein both m and q are not equal to 0, and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; and XCF$_2$O(CF$_2$O)$_m$(C$_2$F$_4$O)$_p$CF$_2$X wherein m is 1 to about 20, p is 1 to about 20 and X is —C(O)NH(CH$_2$)$_q$Si(L)$_3$ wherein q is 1 to about 10 and L is selected from the group consisting of —OR and —NR$_2$ wherein R is an alkyl group containing 1 to about 10 carbon atoms and R' is selected from the group consisting of H and an alkyl group containing 1 to about 10 carbon atoms; and combinations thereof, wherein the average molecular weight of the antisoiling composition is about 800 to about 6000.

In a preferred embodiment the antisoiling composition has an average molecular weight of about 900 to 4000. The antisoiling composition is preferably chosen from the group consisting of C$_3$F$_7$O(CF(CF$_3$)CF$_2$O)$_z$CF(CF$_3$)C(O)NHC$_3$H$_6$Si(OCH$_3$)$_3$, XCF$_2$O(CF$_2$O)$_m$(C$_2$F$_4$O)$_p$CF$_2$X wherein X is —C(O)NH(CH$_2$)$_3$Si(OCH$_3$)$_3$, and combinations thereof. Most preferably, the antisoiling composition is C$_3$F$_7$O(CF(CF$_3$)CF$_2$O)$_z$CF(CF$_3$)C(O)NHC$_3$H$_6$Si(OCH$_3$)$_3$. When the antisoiling composition is C$_3$F$_7$O(CF(CF$_3$)CF$_2$O)$_z$CF(CF$_3$)C(O)NHC$_3$H$_6$Si(OCH$_3$)$_3$, the average molecular weight is preferably between 1000 and 3000.

The antisoiling composition is preferably deposited with a thickness of about 20 to 500 angstroms, more preferably 40 to 100 angstroms. In another aspect, the antisoiling composition is preferably deposited as a monolayer.

The conditions under which the antisoiling composition is vaporized may vary according to the structure and molecular weight of the antisoiling composition. In one aspect of the invention, it is preferred that the vaporizing may take place at pressures less than about 0.01 mmHg. In another aspect of the invention, the vaporizing may take place at temperatures of at least about 80° C.

In yet another aspect of the present invention, the vaporizing comprises placing the antisoiling composition and the antireflective substrate into a chamber, heating the chamber (containing the antisoiling composition), and decreasing the pressure in the chamber. The invention also provides a method wherein the chamber is heated prior to placing the antisoiling composition and antireflective substrate into the chamber. In a preferred embodiment, the antireflective substrate comprises an antireflective ophthalmic lens. Furthermore, the antireflective ophthalmic lens may comprise a polycarbonate resin and an antireflective coating on the surface of the polycarbonate resin.

The present invention also provides a method of depositing an antisoiling composition on an antireflective-coated ophthalmic lens comprising vaporizing an antisoiling composition and depositing the antisoiling composition onto an antireflective coated ophthalmic lens, wherein the antisoiling composition is selected from the group consisting of:

C$_n$F$_{2n+1}$O(CF(CF$_3$)CF$_2$O)$_z$CF(CF$_3$)C(O)NHC$_x$H$_{2x}$Si(L)$_3$ wherein n is 1 to 4, z is 3 to about 15 and x is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms;

X—CF(CF$_3$)(OCF$_2$CF(CF$_3$))$_m$O(C$_n$F$_{2n}$)O(CF(CF$_3$)CF$_2$O)$_q$CF(CF$_3$)—X, wherein m is an integer of 0 to about 40, n is an integer of 2 to 4, q is an integer of 0 to about 40, wherein both m and q are not equal to 0, and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; and XCF$_2$O(CF$_2$O)$_m$(C$_2$F$_4$O)$_p$CF$_2$X wherein m is 1 to about 20, p is 1 to about 20 and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; and combinations thereof, wherein the antisoiling composition is placed in a first chamber and the antireflective coated ophthalmic lens is placed in a second chamber connected to the first chamber such that vaporized antisoiling composition from the first chamber can deposit on the antireflective coated ophthalmic lens in the second chamber. In another aspect of the invention, the second chamber may remain at ambient temperature while the first chamber is heated.

The present invention also provides a method for depositing the antisoiling composition onto an antireflective substrate that may comprise placing the antisoiling composition and the antireflective substrate into a same chamber, heating the chamber (containing the antisoiling composition), and lowering the pressure in the chamber. Under such conditions, the antireflective substrate and the antisoiling composition may be heated to the same temperature.

In a further aspect, the present invention provides a method of preparing an antireflective article comprising depositing an antireflective layer onto the surface of a transparent substrate and vapor depositing an antisoiling layer onto the surface of the antireflective layer wherein the antisoiling layer is selected from the group consisting of:

C$_n$F$_{2n+}$O(CF(CF$_3$)CF$_2$O)$_z$CF(CF$_3$)C(O)NHC$_x$H$_{2x}$Si(L)$_3$ wherein n is 1 to 4, z is 3 to about 15 and x is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms;

X—CF(CF$_3$)(OCF$_2$CF(CF$_3$))$_m$O(C$_n$F$_{2n}$)O(CF(CF$_3$)CF$_2$O)$_q$CF(CF$_3$)—X, wherein m is an integer of 0 to about 40, n is an integer of 2 to 4, q is an integer of 0 to about 40, wherein both m and q are not equal to 0, and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; and XCF$_2$O(CF$_2$O)$_m$(C$_2$F$_4$O)$_p$CF$_2$X wherein m is 1 to about 20, p is 1 to about 20 and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; and combinations thereof, wherein the average molecular weight of the antisoiling composition is about 800 to about 6000.

Antireflective Coatings

Antireflective coatings may include one or more layers of material disposed on a transparent (i.e., light transmissive) substrate, such as glass, quartz, or organic polymeric substrates, including polymethyl methacrylate, polystyrene, polyvinyl chloride, polythiourethane, polyethylene, polypropylene, polycarbonate, polyimide, and polyesters, particularly polyethylene terephthalate. The simplest antireflective coating is a single layer of a transparent material having a refractive index less than that of the substrate on which it is disposed. Multilayer antireflective coatings include two or more layers of dielectric material on a substrate, wherein at least one layer has a refractive index higher than the refractive index of the substrate. They are often referred to as antireflective film stacks.

The antireflective coating may be provided by a wide variety of materials. Preferably, the antireflective coating is provided by a thin metal oxide film, and more preferably, by a thin sputter coated metal oxide film. Herein, "metal oxide" includes oxides of single metals (including metalloids) as well as oxides of metal alloys. Preferred metal oxides include silicon oxides, which may be depleted of oxygen (i.e., wherein the amount of oxygen in the oxide is less than the stoichiometric amount). Preferably, the metal oxide film on the outermost surface includes silicon oxides ($SiO_x$, wherein x is no greater than 2), although other suitable materials include oxides of tin, titanium, niobium, zinc, zirconium, tantalum, yttrium, aluminum, cerium, tungsten, bismuth, indium, and mixtures thereof. Specific examples include $SnO_2$, $TiO_2$, $Nb_2O_5$, $ZnO$, $ZrO_2$, $Ta_2O_5$, $Y_2O_3$, $Al_2O_3$, $CeO_2$, $WO_3$, $Bi_2O$, $In_2O_3$, and ITO (indium tin oxide). Sputter coated metal oxide films are preferred over thermally evaporated films because sputter coated films have higher densities and are harder, smoother, and more stable than thermally evaporated films. Although such sputter coated metal oxide films are relatively porous and consist of clusters of particles with diameters on the order of about 5 nanometers to about 30 nanometers as measured by atomic force microscopy, they are sufficiently impermeable to water and gases that can alter their mechanical, electrical, and optical properties.

Transparent Substrate

Suitable transparent substrates include glass and transparent thermoplastic materials such as poly(meth)acrylate, polycarbonate, polythiourethanes, polystyrene, styrene copolymers, such as acrylonitrile-butadiene-styrene copolymer and acrylonitrile-styrene copolymer, cellulose esters, particularly cellulose acetate and cellulose acetate-butyrate copolymer, polyvinyl chloride, polyolefins, such as polyethylene and polypropylene, polyimide, polyphenyleneoxide, and polyesters, particularly polyethylene terephthalate. The term "poly(meth)acrylate" (or "acrylic") includes materials commonly referred to as cast acrylic sheeting, stretched acrylic, poly(methylmethacrylate) "PMMA," poly(methacrylate), poly(acrylate), poly(methylmethacrylate-co-ethylacrylate), and the like. The substrate thickness can vary, however, for flexible organic films it typically ranges from about 0.1 mm to about 1 mm. Additionally, the organic polymeric substrate can be made by a variety of different methods. For example, the thermoplastic material can be extruded and then cut to the desired dimension. It can be molded to form the desired shape and dimensions. Also, it can be cell cast and subsequently heated and stretched to form the organic polymeric substrate.

The substrate on which the antireflective coating is deposited may include a primed surface. The primed surface can result from the application of a chemical primer layer, such as an acrylic layer, or from chemical etching, electronic beam irradiation, corona treatment, plasma etching, or coextrusion of adhesion promoting layers. Such primed substrates are commercially available. For example, a polyethylene terephthalate substrate primed with an aqueous acrylate latex is available from Imperial Chemical Industries Films, Hopewell, N.C.

The substrate may also include an adhesion-enhancing coating to improve adhesion between the antireflective coating and the substrate. Such coatings are commercially available. The adhesion enhancing coating is particularly desirable for use on flexible organic polymeric substrates. In addition to enhancing adhesion of the antireflective coating to a primed or unprimed organic polymeric substrate, an adhesion enhancing coating may also provide increased durability to an antireflective coating on a flexible organic polymeric substrate by improving the scratch resistance of the antireflective coating.

Antisoiling Composition/Antisoiling Layer

The present invention provides a method of depositing an antisoiling composition on an antireflective substrate comprising vaporizing an antisoiling composition and depositing the antisoiling composition onto an antireflective substrate. An antireflective substrate is any transparent substrate that is part of an antireflective film stack, or any transparent substrate having a surface that is covered in whole or in part with an antireflective composition. The antireflective composition is preferably an antireflective metal oxide, metal fluoride, metal nitride, metal sulfide, or the like. More preferably the antireflective composition is an antireflective metal oxide, and most preferably, the antireflective composition is a sputter coated antireflective metal oxide film (preferably comprising silicon oxides). An antisoiling composition of the present invention renders a surface more resistant to contamination, as by skin oils from fingerprints, for example. It also renders the surface easier to clean, preferably either with dry wiping or with water and detergent. Furthermore, it causes little or no disruption of the optical properties of the surface to which it is applied, particularly the antireflective surface of a film stack. That is, the antisoiling coating of the present invention does not significantly increase the reflectivity of the film stack.

The articles produced by the method of the present invention include a substrate, such as glass or an organic polymeric substrate, optionally having a primed surface on which is coated an optional adhesion enhancing coating, an antireflective composition, preferably, a multilayer film stack, and an antisoiling composition. Preferably the substrate is flexible and the entire article can be stored in roll form.

Antisoiling compositions of the present invention include those selected from the group consisting of $C_nF_{2n+1}O(CF(CF_3)CF_2O)_zCF(CF_3)C(O)NHC_xH_{2x}Si(L)_3$ wherein n is 1 to 4, z is 3 to about 15 and x is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; X—CF(CF$_3$)(OCF$_2$CF(CF$_3$))$_m$O(C$_n$F$_{2n}$)O(CF(CF$_3$)CF$_2$O)$_q$CF(CF$_3$)—X, wherein m is an integer of 0 to about 40, n is an integer of 2 to 4, q is an integer of 0 to about 40, wherein both m and q are not equal to 0; XCF$_2$O(CF$_2$O)$_m$(C$_2$F$_4$O)$_p$CF$_2$X wherein m is 1 to about 20, p is 1 to about 20 and X is —C(O)NH(CH$_2$)$_q$Si(L)$_3$ wherein q is 1 to about 10 and L is selected from the group consisting of —OR and —NR$_{12}$ wherein R is an alkyl group containing 1 to about 10 carbon atoms and R' is selected from the group consisting of H and an alkyl group containing 1 to about 10 carbon atoms; and combinations thereof, wherein the average molecular weight of the antisoiling composition is about 800 to about 6000. By antisoiling it is meant that the compositions, when applied to the surface of an antireflective substrate, increase both the hydrophobicity and hydrophilicity of the antireflective substrate. The hydrophobicity and hydrophilicity may be measured by determining the static contact angles using hexadecane and water, respectively, using a Kruss Drop Shape Analysis instrument (available from Kruss GmbH, Germany).

The overall thickness of the antisoiling composition results from balancing the desire for a thick coating for enhancing antisoiling and durability properties with the desire for a thin coating for maintaining the antireflective properties of the antireflective substrate. Typically, the overall coating thickness of an antisoiling composition of the present invention is from about 20 to 500 angstroms, more preferably from about 40 to 100 angstroms.

The antisoiling compositions used in the method of the present invention preferably have an average molecular weight of 800 to about 6000, more preferably 900 to 4000. Preferred embodiments of the antisoiling composition include C$_3$F$_7$O(CF(CF$_3$)CF$_2$O)$_n$CF(CF$_3$)C(O)NHC$_3$H$_6$Si(OCH$_3$)$_3$, XCF$_2$O(CF$_2$O)$_m$(C$_2$F$_4$O)$_p$CF$_2$X' and X—CF(CF$_3$)(OCF$_2$CF(CF$_3$))$_m$O(C$_n$F$_{2n}$)O(CF(CF$_3$)CF$_2$O)$_q$CF(CF$_3$)—X, wherein m is an integer of 0 to about 40, n is an integer of 2 to 4, q is an integer of 0 to about 40, wherein both m and q are not equal to 0; wherein X is —C(O)NH(CH$_2$)$_3$Si(OCH$_3$)$_3$, and combinations thereof. More preferably, the antisoiling composition is C$_3$F$_7$O(CF(CF$_3$)CF$_2$O)$_n$CF(CF$_3$)C(O)NHC$_3$H$_6$Si(OCH$_3$)$_3$. When the antisoiling composition is C$_3$F$_7$O(CF(CF$_3$)CF$_2$O)$_z$CF(CF$_3$)C(O)NHC$_3$H$_6$Si(OCH$_3$)$_3$, it is preferred that the average molecular weight is about 900 to 4000, most preferably about 1200. When the antisoiling composition is XCF$_2$O(CF$_2$O)$_m$(C$_2$F$_4$O)$_p$CF$_2$X wherein X is C(O)NH(CH$_2$)$_3$Si(OCH$_3$)$_3$, the most preferred average molecular weight is about 2200.

The compositions may be coated or adsorbed onto inert supports for ease in handling, such as is know in the art. Reference may be made to U.S. published applications 2003/0003227 (Kono), incorporated herein by reference.

Vaporizing

The method of the current invention includes depositing an antisoiling composition on an antireflective substrate, wherein the method comprises vaporizing an antisoiling composition and depositing the antisoiling composition onto an antireflective substrate. A wide variety of coating methods have been used to apply antisoiling compositions such as spray coating, knife coating, dip coating, meniscus coating, flow coating, roll coating, and the like. These techniques often require the use of a solvent with the antisoiling composition and equipment that could prove cost-prohibitive on the manufacturing-scale level. Furthermore, these techniques require additional manufacturing floor space and may require additional labor to run.

The deposition method of the current invention may reduce opportunities for contamination of the lens surface through additional handling and exposure to the environment, leading to correspondingly lower yield losses. Thus, the method of the present invention enables application of the antisoiling compositions to antireflective lenses under processing conditions similar to those used in the industry for other applications, at decreased capital equipment costs and with the necessity of solvent usage eliminated.

The method of the current claim comprises vaporizing an antisoiling composition. By vaporizing it is meant that sufficient energy is imparted to the antisoiling composition to cause the antisoiling composition to form a vapor in the gas phase. Vaporizing requires that the chemical structure of the antisoiling composition does not change when entering the gas phase. In one aspect, vaporizing the antisoiling composition may include imparting energy by, e.g., heating, microwave radiation, and the like. Preferably, the temperature is at least about 80° C. More preferably, the temperature does not exceed the decomposition temperature of the antisoiling composition. In another aspect, vaporizing the composition may take place at pressures less than the ambient pressure. More preferably, vaporizing takes place at pressures less than about 1 mmHg, most preferably less than about 0.01 mmHg.

Vaporizing the antisoiling composition may preferably include both heating the antisoiling composition above ambient temperature, more preferably above about 80° C., and reducing the pressure surrounding the antisoiling composition to below ambient pressure, more preferably to below about 0.01 mmHg, simultaneously.

Useful vacuum chambers and equipment are known in the art. One commercially available unit is the 900 DLS available from Satis Vacuum of America, Grove Port, Ohio.

Depositing

The method of the current invention also includes depositing the antisoiling composition onto an antireflective substrate. When deposited on the antireflective substrate, the antisoiling compositions of the current method impart antisoiling properties. Durability of the resulting substrate to dry rub abrasion for the antisoiling compositions of the present invention is far superior compared to other antisoiling compositions.

Depositing the antisoiling composition onto the antireflective substrate may comprise placing the antisoiling composition and the antireflective substrate into a same chamber, heating the chamber (containing the antisoiling composition), and lowering the pressure in the chamber. Under such conditions, the antireflective substrate and the antisoiling composition may be heated to the same temperature.

In another aspect of the invention, the antisoiling composition may be placed in a first chamber and the antireflective substrate may be placed in a second chamber, wherein the chambers are connected, for instance, by a glass tube. In this aspect, the first chamber housing the antisoiling composition may be heated above ambient temperature, more preferably above 80° C. The second chamber may also be heated above ambient temperature, or more preferably may be left at ambient temperature. Alternatively, the second chamber can be cooled below ambient temperature.

When the antisoiling composition is placed in a first chamber and the antireflective substrate may be placed in a second chamber, wherein the chambers are connected, for instance, by a glass tube, the pressure in both chambers may be the same. Preferably, the pressure in both chambers is below atmospheric pressure, more preferably below 0.01 mmHg. Furthermore, the present invention contemplates that the size, and shape of the first and second chambers may be altered so as to maximize the amount of antisoiling composition deposited on the antireflective substrate in the second chamber. Furthermore, the means of connecting the first and second chambers as well as the relative spatial disposition of the two chambers (as well as vertical or horizontal orientation of the chambers) may be altered to maximize the amount of antisoiling composition deposited on the antireflective substrate in the second chamber.

EXAMPLES

Advantages of the invention are illustrated by the following examples. The particular materials and amounts thereof recited in these examples, as well as other conditions and details, are to be interpreted to apply broadly in the art and should not be construed to unduly limit the invention.

| Designator | Structure, Formula and/or Chemical name | Availability |
|---|---|---|
| HEPO Silane | $C_3F_7O(CF(CF_3)CF_2O)_mCF(CF_3)\text{-C(=O)-NH-}(CH_2)_3\text{-}Si(OMe)_3$<br>$m_{avg} \sim 7\text{-}8$ | Can be prepared using methods as described in U.S. Pat. No. 3,646,085 |
| PFPE Disilane | $XCF_2O(CF_2O)_n(C_2F_4O)_mCF_2X$<br>Where $X = CONH(CH_2)_3Si(OCH_3)_3$<br>$m_{avg}, n_{avg}$ range ~10–12 | Prepared as described in U.S. Pat. No. 3,810,874 |

Static Contact Angle Measurement Method

Static contact angles were determined for both water and hexadecane using a "KRUSS G120/G140 MKI" goniometer (available from Kruss USA, Charlotte, N.C.). The contact angles were measured before (initial) and directly after abrasion (abrasion), unless otherwise indicated. The values are the mean values of 4 measurements and are reported in degrees. The minimum measurable value for a contact angle was 20. A value <20 meant that the liquid spread on the surface.

Dynamic Contact Angle Measurement Method

Where reported, advancing and receding contact angles were measured using a VCA-2500XE video contact angle analyzer (AST Products, Billerica, Mass.). For both contact angle measurement methods, larger values of contact angles indicate better repellency.

Dip-Coating Method 1

An automated dip coater (Unislide™ Assemblies, Velmex Inc., Bloomfield, N.Y.) was used for the dipping, at a withdrawal speed of 3–4 mm/sec. The microscope slides were dip coated in a freshly prepared solution of 0.1 wt % FC in HFE-7100. (available from 3M Company, St. Paul) The microscope slides were placed in a forced-air oven at 60° C. for 1 hr and cooled before testing.

Abrasion/Scrub Test

Durability of the coatings was tested using a "PAUL GARDNER" Model 12VFI linear abrader, available from Paul N. Gardner Co., Pompano Beach, Fla. Each glass slide, having a layer of vapor deposited material upon it, was scrubbed using a "3M HIGH PERFORMANCE" wipe (available from 3M Company, St. Paul, Minn.) covering a "PAUL GARDNER WA-2225" abrasive pad (450.0 g; dimensions: 10.5 cm×5.1 cm) for the appropriate reported number of abrasion cycles.

Vapor Deposition Chamber 1.

Vapor Deposition Chamber 1 was a two liter glass reaction flask, consisting of two pieces, each with a ground glass joint (available from Ace Glass Co., Vineland, N.J.; 2 liter Reaction flask, Catalog No. 6511-56; Flask Head, Catalog No. 6512-20). In order to achieve a higher vacuum, silicone grease was applied to the ground glass joint. The Chamber was clamped in a vertical position to a support, and the glass slide to be coated (25×75 mm; available from VWR Scientific, West Chester, Pa.) was placed in the bottom piece of the Chamber. The upper piece of the Chamber had access points for a thermocouple (J-Type, available from Omega Engineering, Stamford, Conn.) vacuum gauge and a take-off port to a silicone oil pump. The thermocouple was placed in contact with the glass)

Vapor Deposition Chamber 2

Vapor Deposition Chamber 2 was a custom-made two-liter glass vessel, consisting of a 22 cm long by 11 cm diameter cylindrical vacuum chamber, one end of which is connect via an o-ring joint to a sample tube. The other end of the vacuum chamber was connected to a vacuum source. The vacuum chamber consisted of two pieces joined by an o-ring joint to allow disassembly and insertion of substrates to be treated. The vacuum chamber was clamped in the horizontal position.

Example 1

Vapor Deposition of HFPO Silane

Into Vapor Deposition Chamber 1 was placed a 5 dram vial containing about 3 drops of HFPO Silane, and a microscope slide (25×75 mm; available from VWR Scientific, West Chester. PA). Using a silicone oil vacuum pump, a vacuum of 0.002 mm Hg (0.27 Pascal) was achieved and the chamber was then heated to 90° C. (outer glass temperature) using a heating mantle. The sample was subjected to this heat and pressure for one hour, then the chamber was cooled, the vacuum was broken and the chamber opened. The ensuing coated sample was tested using the water Static Contact Angle Measurement test listed above. Results are listed in Table 1

Example 2

Vapor Deposition of PFPE Disilane

Into Vapor Deposition Chamber 1 was placed a 5 dram vial containing about 3 drops of PFPE disilane and a microscope slide (25×75 mm). Using a silicone oil vacuum pump, a vacuum of 0.003 mm Hg (0.4 Pascal) was achieved and the chamber was then heated to 150° C. (outer glass temperature) using a heating mantle. The sample was subjected to this heat and pressure for 30 minutes, then the chamber was cooled, the vacuum was broken and the chamber opened. The ensuing coated sample was tested using the water Static Contact Angle Measurement test listed above. Results are listed in Table 1

Comparative Example C-1

Comparative Example C-1 is a clean, untreated microscope slide.

TABLE 1

| | Contact Angle (°) | |
|---|---|---|
| Example | Water | Hexadecane |
| 1 | 95.3 | 63.3 |
| 2 | 97.5 | 53.4 |
| C-1 | <20 | <20 |

Examples 3–8

Examples 3–8 were prepared by first using a heating mantle to heat the Vapor Deposition Chamber 1 to the temperature listed in Table 2. The temperature was measured on the inside of the chamber (1 cm from the sample location). Then a 5 dram vial containing about 3 drops of the fluorochemical (FC) as listed in Table 2 and a microscope slide (25×75 mm) were placed into the chamber. Using a silicone oil vacuum pump, the heated chamber was subjected to a vacuum of 0.002 mm Hg (0.27 Pascal). The sample was subjected to this heat and pressure for 3 minutes, then the chamber was cooled, the vacuum was broken and the chamber opened. The ensuing coated sample was tested using the Abrasion/Scrub Test and water and hexadecane Static Contact Angle Measurement tests listed above. The results are listed in Table 2

Comparative Example C-2

Comparative Example C-2 was prepared using standard dip coating methods as described in Dip Coating Method 1.

TABLE 2

| | | Abrasion cycles Temp | Static Water/Hexadecane contact Angle (°) | | | | | |
|---|---|---|---|---|---|---|---|---|
| Example | FC | (° C.) | 0 | 5,000 | 7,000 | 9,000 | 11,000 | 12,000 |
| 3 | PFPE Disilane | 150 | 107/66 | 101/59 | 102/56 | 101/54 | 103/55 | 103/56 |
| 4 | PFPE Disilane | 120 | 92/61 | 88/49 | 83/48 | 86/46 | 90/47 | 91/44 |
| 5 | PEPE Disilane | 180 | 105/66 | 97/54 | 96/50 | 90/51 | 93/51 | 91/49 |
| 6 | HFPO Silane | 150 | 90/67 | 111/66 | 110/66 | 110/62 | 108/64 | 106/63 |
| 7 | HFPO Silane | 120 | 96/63 | 94/52 | 88/47 | 81/44 | 81/42 | 48/41 |
| 8 | HFPO Silane | 180 | 100/63 | 89/47 | 77/41 | ** | ** | ** |
| C-2 | PFPE Disilane | Dip coated | 112/69 | 104/61 | 100/57 | 100/56 | 95/54 | 98/57 |

**Data not recorded

Example 9

Example 9 was prepared following the procedure listed for Example 6 with the exception that the microscope slide was replaced with an ophthalmic lens (polycarbonate resin with scratch resistant and anti-reflective coating, available from Twin City Optical, Minneapolis, Minn.) and the sample was maintained at 150° C. and 0.002 mm Hg (0.27 Pascal) vacuum for 5 minutes. The ensuing coated sample was tested using the Abrasion/Scrub Test and water Static Contact Angle Measurement tests listed above. The results are listed in Table 3.

TABLE 3

| | | Abrasion cycles Temp | Static Water Contact Angle (°) | | | | | |
|---|---|---|---|---|---|---|---|---|
| Example | FC | (° C.) | 0 | 50 | 150 | 270 | 350 | 510 |
| 9 | HFPO Silane | 150 | 107 | 102 | 100 | 97 | 97 | 85 |

Examples 10–13

Vapor Deposition Chamber 2, fitted with a sample tube (14.0 cm), was charged with fluorochemical (FC; 0.4 g) as listed in Table 4, and a glass microscope slide (25×75 mm) that had been cleaned using a UV/ozone treatment as follows: the slides were subjected for 5 minutes to ultraviolet light and ozone in an apparatus in which an ultraviolet lamp (5 inch by 5 inch square (12.5 cm by 12.5 cm) ultraviolet lamp obtained under the trade designation "UV GRID LAMP" from BHK, Claremont, Calif., model 88-9102-02) was encased in a small sheet metal box (13 cm wide times 14 cm deep.times.15 cm high) such that the lamp was suspended 8 cm above the bottom of the box. A small lab jack was used to position silicon wafer pieces to be cleaned as close as possible to the ultraviolet lamp without physically contacting the lamp. The front of the box was a door, hinged at the top, which allowed samples to be inserted and removed. A small hole in one side of the box was attached to a source of oxygen that flowed into the box at a rate of approximately 1 to 5 standard liters per minute.

Using a Mercury Diffusion pump, a vacuum of less than $1 \times 10^{-4}$ mbar was achieved. The sample tube was then heated to 300–310° C. for 30 minutes. The chamber was cooled, the vacuum was broken and the chamber opened. The ensuing coated samples were removed from the chamber and were further heated at 80° C. for 1 hour, cooled to room temperature, then tested using the water Static and Dynamic Contact Angle Measurement Methods listed above. Results are listed in Table 4

TABLE 4

| Example | FC | Static water contact angle (°) | Advancing water contact angle (°) | Receding water contact angle (°) |
|---|---|---|---|---|
| 10 | PFPE Disilane | 108 | 120 | 97 |
| 11 | PFPE Disilane | 109 | 118 | 92 |
| 12 | HFPO Silane | 110 | 120 | 86 |
| 13 | HFPO Silane | 106 | 118 | 90 |

Examples 13–15

Vapor Deposition Chamber 2, fitted with a sample tube (9.0 cm), was charged with HFPO Silane (0.4 g), and three glass microscope slides (available from XX) that had been cleaned using a UV/ozone treatment. Using a Mercury Diffusion pump, a vacuum of less than $1 \times 10^{-4}$ mbar was achieved. The sample tube was then heated to 320° C. for 1 hour. Under these conditions excess liquid HFPO Silane was observed on the glass slides, with the largest deposition of liquid being on the glass slide closest to the sample tube ("Near" designation in Table 5). The chamber was cooled, the vacuum was broken and the chamber opened. The ensuing coated samples were removed from the chamber and further heated at 80° C. for 1 hour, cooled to room temperature, lightly buffed with a "KIMWIPE" (available from Kimberly Clark, Roswell, Ga.), then tested using the water Static Contact Angle Measurement Methods listed above. Results are listed in Table 5.

TABLE 5

| | Abrasion cycles Glass Slide | Static Water Contact Angle (°) | | | | | |
|---|---|---|---|---|---|---|---|
| Example | Position | 0 | 320 | 420 | 520 | 620 | 720 |
| 13 | Near | 113 | 104 | 103 | 104 | 102 | 103 |
| 14 | Center | 113 | 101 | 102 | 104 | 100 | 100 |
| 15 | Far | 112 | 101 | 100 | 101 | 100 | 102 |

Examples 16–18

Examples 16–18 were prepared by following the procedure described for Examples 13–14, with the exception that the vacuum was applied at $6 \times 10^{-5}$ mbar and the sample tube length was 14.0 cm. No excess liquid was observed on the glass slides upon removal from the chamber.

TABLE 6

| | Abrasion cycles Glass Slide | Static Water Contact Angle (°) | | | | | |
|---|---|---|---|---|---|---|---|
| Example | Position | 0 | 320 | 420 | 520 | 620 | 720 |
| 16 | Near | 99 | 102 | 90 | 91 | 87 | 87 |
| 17 | Center | 107 | 103 | 103 | 102 | 104 | 102 |
| 18 | Far | 105 | 95 | 94 | 92 | 94 | 91 |

What is claimed is:

1. A method of depositing an antisoiling composition on an antireflective coated ophthalmic lens comprising vaporizing an antisoiling composition and depositing the antisoiling composition onto an antireflective coated ophthalmic lens, wherein the antisoiling composition is selected from the group consisting of:

$C_nF_{2n+1}O(CF(CF_3)CF_2O)_zCF(CF_3)C(O)NHC_xH_{2x}Si(L)_3$
wherein n is 1 to 4, z is 3 to about 15 and x is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms;

X—CF(CF$_3$)(OCF$_2$CF(CF$_3$))$_m$O(C$_n$F$_{2n}$)O(CF(CF$_3$)CF$_2$O)$_q$CF(CF$_3$)—X,
wherein m is an integer of 0 to about 40, n is an integer of 2 to 4, q is an integer of 0 to about 40, wherein both m and q are not equal to 0, and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms;

XCF$_2$O(CF$_2$O(C$_2$F$_4$O)$_p$ CF$_2$X wherein m is 1 to about 20, p is 1 to about 20 and X is —C(O)NH(CH$_2$)$_q$Si(L)$_3$ wherein q is 1 to about 10 and L is selected from the group consisting of —OR and —NR'$_2$ wherein R is an alkyl group containing 1 to about 10 carbon atoms and R' is selected from the group consisting of H and an alkyl group containing 1 to about 10 carbon atoms; and combinations thereof, wherein the average molecular weight of the antisoiling composition is about 800 to about 6000 and wherein the antisoiling composition is placed in a first chamber and the antireflective coated ophthalmic lens is placed in a second chamber connected to the first chamber such that vaporized antisoiling composition from the first chamber can deposit on the antireflective coated ophthalmic lens in the second chamber.

2. A method according to claim 1 wherein the first chamber is heated, the second chamber remains at ambient temperature, and the pressure in both the first and second chamber is below atmospheric pressure.

3. A method according to claim 1 wherein vaporizing takes place at pressures less than 0.01 mmHg.

4. A method according to claim 1 wherein vaporizing takes place at temperatures of at least 80° C.

5. A method according to claim 1 wherein the antisoiling composition has an average molecular weight of about 900 to 4000.

6. A method according to claim 1 wherein the antisoiling composition is selected from the group consisting of:

$C_3F_7O(CF(CF_3)CF_2O)_zCF(CF_3)C(O)NHC_3H_6Si(OCH_3)_3$, wherein z is 3 to about 15;

$X-CF(CF_3)(OCF_2CF(CF_3))_mO(C_nF_{2n})O(CF(CF_3)CF_2O)_qCF(CF_3)-X$, wherein m is an integer of 0 to about 40, n is an integer of 2 to 4, q is an integer of 0 to about 40, wherein both m and q are not equal to 0 and X is $-C(O)NH(CH_2)_3Si(OCH_3)_3$;

$X-CF_2O(CF_2O)_m(C_2F_4O)_pCF_2-X$ wherein m is 1 to 20, p is 1 to 20 and X is $-C(O)NH(CH_2)_3Si(OCH_3)_3$;

and combinations thereof.

7. A method according to claim 1 wherein the antisoiling composition is $C_3F_7O(CF(CF_3)CF_2O)_zCF(CF_3)C(O)NHC_3H_6Si(OCH_3)_3$ and wherein z is 3 to about 15.

8. A method according to claim 1 wherein the antisoiling composition deposited onto the antireflective coated ophthalmic lens has a thickness of 20 to 500 angstroms.

9. A method according to claim 1 wherein the antisoiling composition deposited onto the antireflective coated ophthalmic lens forms a monolayer.

10. A method according to claim 1 wherein vaporizing the antisoiling composition comprises placing the antisoiling composition into the first chamber, heating the first chamber containing the antisoiling composition, and decreasing the pressure in the chamber.

11. A method according to claim 1 wherein the antireflective ophthalmic lens comprises a polycarbonate resin and an antireflective coating on a surface of the polycarbonate resin.

12. A method according to claim 11 wherein the antireflective coating is selected from the group consisting of a metal oxide, a metal fluoride, a metal nitride, and a metal sulfide.

13. A method according to claim 12 wherein the antireflective coating comprises silicon dioxide.

14. A method according to claim 1 further comprising depositing multiple antireflective layers onto the surface of the transparent substrate before vapor depositing the antisoiling layer.

* * * * *

UNITED STATES PATENT AND TRADEMARK OFFICE
CERTIFICATE OF CORRECTION

PATENT NO. : 6,991,826 B2
APPLICATION NO. : 10/828451
DATED : January 31, 2006
INVENTOR(S) : Mark J. Pellerite It is certified that error appears in the above-identified patent and that said Letters Patent is hereby corrected as shown below:

Column 3
Line 23, insert -- : -- following "consisting of".
Line 62 delete, "$C_nF_{2n+1}O(CF(CF_3)CF_2O)_zCF(CF_3)C(0)NIIC_xII_{2x}Si(L)_3$" and insert -- $C_nF_{2n}+_1O(CF(CF_3)CF_2O)_zCF(CF_3)C(0)NHC_xH_{2x}Si(L)_3$ -- in place thereof.

Column 4
Line 42, delete "$C_nF_{2n+}$" and insert -- $C_nF_{2n+1}$ -- in place thereof.

Column 7
Line 28, delete "$C_3F_7O(CF(CF_3)CF_2O)_n$" and insert -- $C_3F_7O(CF(CF_3)CF_2O)_z$ -- in place thereof.
Line 29, delete "$CF_2X$'" and insert -- $CF_2X$, -- in place thereof.
Line 35, delete "$C_3F_7O(CF(CF_3)CF_2O)_n$" and insert -- $C_3F_7O(CF(CF_3)CF_2O)_z$ -- in place thereof.
Line 37, delete "is$C_3F_7O$" and insert -- is $C_3F_7O$ -- in place thereof.

Column 9
Line 14, delete "HEPO" below "Designator" and insert -- HFPO -- in place thereof.

Column 10
Line 31, insert -- , -- following "Conn.)".
Line 33, delete "glass)" and insert -- glass. -- in place thereof.

Column 10
Line 66, insert -- . -- following "Table 1".

Column 11
Line 38, insert -- . -- following "Table 1".

Column 12
Line 4, insert -- . -- following "Table 2".
Example 5, Line 1, Table 2, delete "PEPE" and insert -- PFPE -- in place thereof.

Column 13
Line 1, delete "wide times" and insert -- wide.times. -- in place thereof.
Line 18, insert -- . -- following "Table 4".

Column 14
Line 40, Claim 1, delete "$XCF_2O(CF_2O(C_2F_4O)_p$" and insert -- $XCF_2O(CF_2O)_m(C_2F_4O)_p$ -- in place thereof.

UNITED STATES PATENT AND TRADEMARK OFFICE
CERTIFICATE OF CORRECTION

PATENT NO. : 6,991,826 B2
APPLICATION NO. : 10/828451
DATED : January 31, 2006
INVENTOR(S) : Mark J. Pellerite It is certified that error appears in the above-identified patent and that said Letters Patent is hereby corrected as shown below:

<u>Column 15</u>
Line 6, Claim 6, delete "($CF_3$—X," and insert -- ($CF_3$)—X, -- in place thereof.

Signed and Sealed this

Sixteenth Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 6,991,826 B2
APPLICATION NO. : 10/828451
DATED : January 31, 2006
INVENTOR(S) : Mark J. Pellerite It is certified that error appears in the above-identified patent and that said Letters Patent is hereby corrected as shown below:

Column 3
Line 23, insert -- : -- following "consisting of".
Line 62, $CnF_{2n+1}0(CF(CF_3)CF_20)_zCF(CF_3)C(0)NIIC_xII_{2x}Si(L)_3$ and insert -- $C_nF_{2n+1}0(CF(CF_3)CF_20)_zCF(CF_3)C(0)NHC_xH_{2x}Si(L)_3$ -- in place thereof.

Column 4
Line 42, delete "$C_nF_{2n+}$" and insert -- $C_nF_{2n+1}$ -- in place thereof.

Column 7
Line 28, delete "$C_3F_7O(CF(CF_3)CF_2O)_n$" and insert -- $C_3F_7O(CF(CF_3)CF_2O)_z$ -- in place thereof.
Line 29, delete "$CF_2X$'" and insert -- $CF_2X$, -- in place thereof.
Line 35, delete "$C_3F_7O(CF(CF_3)CF_2O)_n$" and insert -- $C_3F_7O(CF(CF_3)CF_2O)_z$ -- in place thereof.
Line 37, delete "is$C_3F_7O$" and insert -- is $C_3F_7O$ -- in place thereof.

Column 9
Line 14, delete "HEPO" below "Designator" and insert -- HFPO -- in place thereof.

Column 10
Line 31, insert -- , -- following "Conn.)".
Line 33, delete "glass)" and insert -- glass. -- in place thereof.

Column 10
Line 66, insert -- . -- following "Table 1".

Column 11
Line 38, insert -- . -- following "Table 1".

Column 12
Line 4, insert -- . -- following "Table 2".
Example 5, Line 1, Table 2, delete "PEPE" and insert -- PFPE -- in place thereof.

Column 13
Line 1, delete "wide times" and insert -- wide.times. -- in place thereof.
Line 18, insert -- . -- following "Table 4".

UNITED STATES PATENT AND TRADEMARK OFFICE
CERTIFICATE OF CORRECTION

PATENT NO. : 6,991,826 B2
APPLICATION NO. : 10/828451
DATED : January 31, 2006
INVENTOR(S) : Mark J. Pellerite It is certified that error appears in the above-identified patent and that said Letters Patent is hereby corrected as shown below:

Column 14
Line 40, Claim 1, delete "$XCF_2O(CF_2O(C_2F_4O)_p$" and insert
-- $XCF_2O(CF_2O)_m(C_2F_4O)_p$ -- in place thereof.

Column 15
Line 6, Claim 6, delete "$(CF_3—X,$" and insert -- $(CF_3)—X,$ -- in place thereof.

Signed and Sealed this

Thirtieth Day of October, 2007

JON W. DUDAS
*Director of the United States Patent and Trademark Office*